(12) United States Patent
Mueller et al.

(10) Patent No.: US 6,417,019 B1
(45) Date of Patent: Jul. 9, 2002

(54) PHOSPHOR CONVERTED LIGHT EMITTING DIODE

(75) Inventors: Gerd O. Mueller; Regina B. Mueller-Mach, both of San Jose, CA (US)

(73) Assignee: LumiLeds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/827,382

(22) Filed: Apr. 4, 2001

(51) Int. Cl.$^7$ .......................... H01L 21/00; H01L 33/00; H01L 23/29; G02B 26/00
(52) U.S. Cl. ............................ 438/29; 257/98; 257/99; 257/100; 257/788; 359/294
(58) Field of Search ............................. 438/29, 38, 49, 438/69, 70, 71, 72; 372/11, 32, 49; 359/248, 273, 294, 581; 257/98, 99, 100, 788, 789, 790, 793

(56) References Cited

U.S. PATENT DOCUMENTS

| | | | |
|---|---|---|---|
| 5,959,316 A | 9/1999 | Lowery | 257/98 |
| 6,133,589 A | 10/2000 | Krames et al. | 257/103 |
| 6,252,254 B1 * | 6/2001 | Soules et al. | 257/89 |
| 6,255,670 B1 * | 7/2001 | Srivastava et al. | 257/89 |
| 6,273,589 B1 | 8/2001 | Weber et al. | 362/293 |
| 6,294,800 B1 * | 9/2001 | Duggal et al. | 257/89 |

FOREIGN PATENT DOCUMENTS

| | | |
|---|---|---|
| WO | WO 00/33389 | 6/2000 |
| WO | WO 00/33390 | 6/2000 |

OTHER PUBLICATIONS

P. Benalloul et al., "IIA–III$_2$–S$_4$ Ternaly Compounds: New Host Matrices For Full Color Thin film Electroluminescence Displays", Appl. Phys. Lett., pp. 1954–1956.

T. E. Peters et al., "Luminescence And Structural Properties Of Tiogallate Phosphors Ce$^{+3}$ And Eu$^{+2}$–Activated Phosphors. Part I", J. Electrochem. Soc.: Solid–State Science and Technology, Feb. 1972, pp. 230–236.

K. T. Le Thi et al., "Investigation Of The MS–Al$_2$S$_3$ Systems (M=Ca, Sr, Ba) And Luminescence Properties Of Europium–Doped Thioaluminates", Materials Science and Engineering, B14 1992, pp. 393–397.

M. R. Davolos et al., "Luminescence Of Eu$^{2+}$ In Strontium And Barium Thiogallates", Journal of Solid State Chemistry 83, 1989, pp. 316–323.

Copy of co–pending U.S. application No. 09/405,947, filed Sep. 27, 1999, 19 pages.

P. Bénalloul, C. Barthou, J. Benoit, SrGa$_2$S$_4$: RE phosphors for full colour electroluminescent displays:, Journal of Alloys and Compounds 275–277 (1998), pp. 709–715.

* cited by examiner

*Primary Examiner*—John F. Niebling
*Assistant Examiner*—Viktor Simkovic
(74) *Attorney, Agent, or Firm*—Skjerven Morrill LLP; Mark E. Schmidt

(57) ABSTRACT

A method of fabricating a light emitting device includes providing a light emitting diode that emits primary light, and locating proximate to the light emitting diode a $(Sr_{1-u-v-x}Mg_uCa_vBa_x)(Ga_{2-y-z}Al_yIn_zS_4):Eu^{2+}$ phosphor material capable of absorbing at least a portion of the primary light and emitting secondary light having a wavelength longer than a wavelength of the primary light. The composition of the phosphor material can be selected to determine the wavelengths of the secondary light. In one embodiment, the light emitting device includes the phosphor material dispersed as phosphor particles in another material disposed around the light emitting diode. In another embodiment, the light emitting device includes the phosphor material deposited as a phosphor film on at least one surface of the light emitting diode.

34 Claims, 8 Drawing Sheets

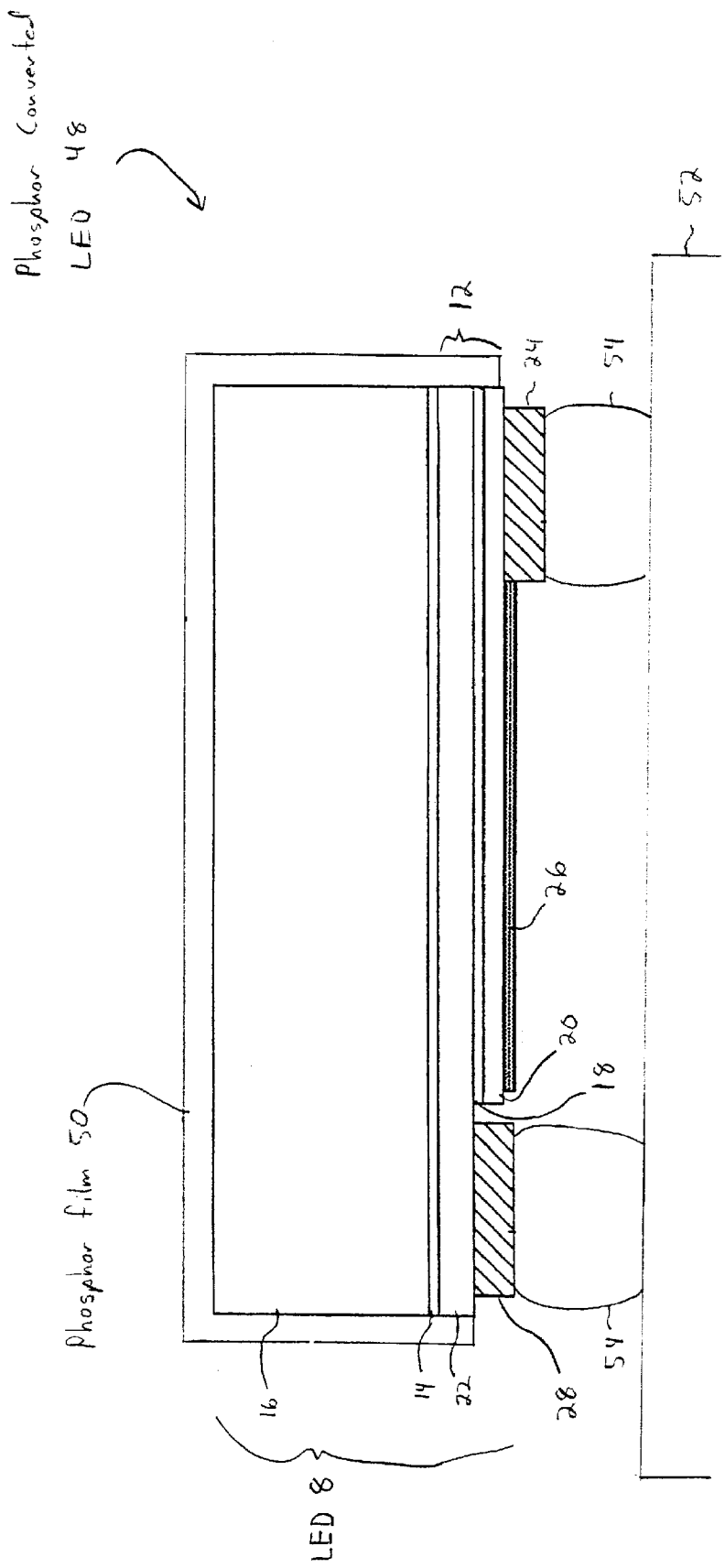

PHOSPHOR CONVERTED LIGHT EMITTING DIODE

BACKGROUND OF THE INVENTION

1. Field of the Invention

The present invention relates generally to light emitting devices and more particularly to phosphor converted light emitting devices.

2. Description of the Related Art

The emission spectrum of a light emitting diode (LED) typically exhibits a single rather narrow peak at a wavelength (peak wavelength) determined by the structure of the light emitting diode and the composition of the materials from which it is constructed. For example, the emission spectra of $Al_xIn_yGa_zN$ based LEDs typically peak at wavelengths from about 400 nanometers (nm) to about 590 nm and typically have full widths at half maximum of about 20 nm to about 50 nm. Similarly, the emission spectra of $Al_xIn_yGa_zP$ based LEDs typically peak at wavelengths from about 580 nm to about 660 nm and typically have full widths at half maximum of about 13 nm to about 30 nm. In the notations $Al_xIn_yGa_zN$ and $Al_xIn_yGa_zP$, it should be noted that $0 \leq x \leq 1$, $0 \leq y \leq 1$, $0 \leq z \leq 1$, and $x+y+z=1$.

The most efficient LEDs emitting at wavelengths between about 400 nm and about 660 nm (as characterized by external quantum efficiency, for example) are currently $Al_xIn_yGa_zN$ and $Al_xIn_yGa_zP$ based LEDs. However, the efficiency of an LED of either type is strongly dependent on the peak emission wavelength of the LED. In particular, the efficiencies of $Al_xIn_yGa_zN$ and $Al_xIn_yGa_zP$ based LEDs show a broad minimum at peak emission wavelengths between about 515 nm and about 590 nm. This broad minimum, which unfortunately includes the spectral range in which the sensitivity of the human eye peaks, inhibits the development of many otherwise commercially attractive applications for LEDs.

An additional drawback of conventional $Al_xIn_yGa_zN$ based LEDs is the substantial blue shift in their emission which occurs with increasing drive current, particularly for LEDs having peak emission wavelengths between about 510 nm and about 590 nm. This blue shift is very noticeable for drive current modulation methods used to regulate LED radiance in display applications, for example, and consequently must be compensated for at additional cost.

A further drawback of conventional $Al_xIn_yGa_zN$ and $Al_xIn_yGa_zP$ based LEDs is the variability in emission characteristics between LEDs from separate wafers, or from different regions on the same wafer, prepared under nominally identical manufacturing conditions and by nominally identical methods. This variability results from the sensitivity of an LED's emission characteristics to small variations in, for example, the composition and thickness of the various semiconductor layers it includes, particularly those in the active region. As a result of this variability, it is difficult to achieve high production yields in narrow peak wavelength ranges (bins).

What is needed is an LED based light emitting device that overcomes these and other drawbacks of conventional LEDs.

SUMMARY

A method of fabricating a light emitting device includes providing a light emitting diode that emits primary light, and locating proximate to the light emitting diode a $(Sr_{1-u-v-x}Mg_uCa_vBa_x)(Ga_{2-y-z}Al_yIn_zS_4):Eu^{2+}$ phosphor material capable of absorbing at least a portion of the primary light and emitting secondary light having a wavelength longer than a wavelength of the primary light. The composition of the phosphor material, i.e., the values of u, v, x, y, and z, can be selected to determine the wavelengths of the secondary light. In one implementation the light emitting diode includes an $Al_xIn_yGa_zN$ material. In another implementation, the light emitting diode is a laser diode.

In one embodiment, the light emitting device includes the $(Sr_{1-u-v-x}Mg_uCa_vBa_x)(Ga_{2-y-z}Al_yIn_zS_4):Eu^{2+}$ phosphor material dispersed as phosphor particles in another material disposed around the light emitting diode. The phosphor particles and the material in which they are dispersed may be disposed as a layer on one or more surfaces of the light emitting diode. The material in which the phosphor particles are dispersed is selected, for example, from materials including but not limited to epoxies, acrylic polymers, polycarbonates, silicone polymers, optical glasses, and chalcogenide glasses. Preferably, the material in which the phosphor particles are dispersed has a refractive index greater than about 1.5. More preferably, the refractive index is greater than about 2.1. The concentration of the phosphor particles can be selected to absorb a predetermined fraction of the primary light and thereby adjust the chromaticity of a mixture of the primary and secondary light.

In another embodiment, the light emitting device includes the $(Sr_{1-u-v-x}Mg_uCa_vBa_x)(Ga_{2-y-z}Al_yIn_zS_4):Eu^{2+}$ phosphor material deposited as an optically homogeneous phosphor film on one or more surfaces of the light emitting diode. The phosphor film may be, for example, a film of substantially pure $(Sr_{1-u-v-x}Mg_uCa_vBa_x)(Ga_{2-y-z}Al_yIn_zS_4):Eu^{2+}$ phosphor material. The thickness of the phosphor film can be selected to absorb a predetermined fraction of the primary light and thereby adjust the chromaticity of a mixture of the primary and secondary light.

Light emitting devices in accordance with embodiments of the present invention are efficient light sources in the spectral range in which conventional $Al_xIn_yGa_zN$ and $Al_xIn_yGa_zP$ based LEDs show a broad minimum in efficiency, exhibit little or no blue shift with increasing drive current, and may be manufactured with high production yields in narrow peak wavelength ranges.

DETAILED DESCRIPTION

In accordance with an embodiment of the present invention, blue or ultraviolet light emitted from an LED (primary light) excites $Eu^{2+}$ doped $IIA\text{-}IIIA_2\text{-}S_4$ phosphors that in response emit longer wavelength (secondary) light. As used herein, "primary light" refers to light emitted by a light emitting diode and "secondary light" refers to light emitted by a phosphor. The blue or ultraviolet primary light may have wavelengths of, for example, about 320 nanometers (nm) to about 510 nm. As used herein, "IIA" and "IIIA" designate columns in the periodic table of the elements in accordance with the Chemical Abstracts Service numbering system.

Conventional phosphors typically include an inorganic crystalline host material having an ionic lattice and dopants that replace lattice ions. The dopants are capable of emitting light upon absorbing excitation radiation. Preferably, the dopants strongly absorb excitation radiation and efficiently convert this energy into emitted radiation. Unfortunately, most conventional phosphors were developed for use in cathode ray tubes and fluorescent lights in which phosphors are excited, respectively, by high energy electrons and by ultraviolet emission (~254 nm) from a mercury discharge. Consequently, most conventional phosphors are unsuitable for excitation by blue or ultraviolet emitting LEDs.

The inventors have discovered that $Eu^{2+}$ doped $IIA\text{-}IIIA_2\text{-}S_4$ compounds, particularly $(Sr_{1-u-v-x}Mg_uCa_vBa_x)(Ga_{2-y-z}Al_yIn_zS_4):Eu^{2+}$ materials in which $0 \leq u \leq 1, 0 \leq v \leq 1, 0 \leq x \leq 1, 0 \leq (u+v+x) \leq 1, 0 \leq y \leq 2, 0 \leq z \leq 2$, and $0 \leq y+z \leq 2$, can be advantageously employed as phosphors to convert blue and ultraviolet emission from LEDs to longer wavelength radiation. Some of these materials have previously been studied, for example, to test crystal field theories of dopant luminescence in alkaline earth sulfides. Absorption and emission spectra of some of these materials are reported, for example, in M. R. Davolos et al. "Luminescence of $Eu^{2+}$ in Strontium and Barium Thiogallates," Journal of Solid State Chemistry 83, 316–323 (1989), incorporated herein by reference. in K. T. Le Thi et al., "Investigation of the MS—$Al_2S_3$ systems (M=Ca, Sr, Ba) and luminescence properties of Europium-doped thioaluminates," Materials Science and Engineering B14, 393–397 (1992) incorporated herein by reference, and T. E. Peters et al., "Luminescence and Structural Properties of Thiogallate Phosphors $Ce^{+3}$ and $Eu^{+2}$-Activated Phosphors Part 1," Journal of the Electrochemical Society: Solid State Science and Technology. February 1972, page 230, incorporated herein by reference. These papers also report synthetic routes by which $(Sr_{1-u-v-x}Mg_uCa_vBa_x)(Ga_{2-y-z}Al_yIn_zS_4):Eu^{2+}$ materials are prepared.

Figure 1:
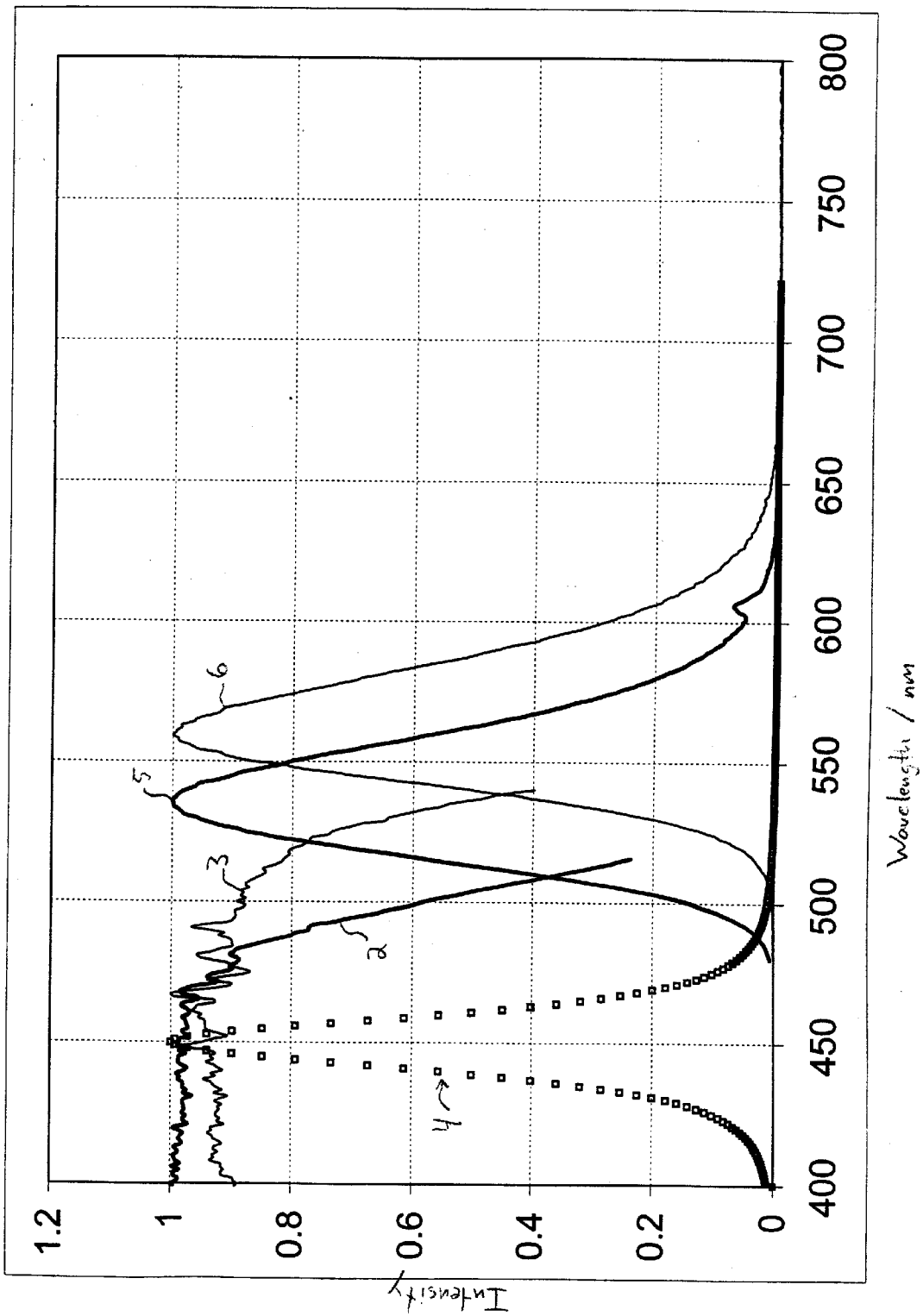
FIG. 1 illustrates a superposition of $SrGa_2S_4:Eu^{2+}$ excitation and emission spectra, $CaGa_2S_4:Eu^{2+}$ excitation and emission spectra, and an $Al_xIn_yGa_zN$ based LED emission spectrum.

Referring to FIG. 1, the excitation spectrum 2 of $SrGa_2S_4:Eu^{2+}$ extends from about 500 nm into the ultraviolet. The excitation spectrum 3 of $CaGa_2S_4:Eu^{2+}$ similarly extends from about 530 nm into the ultraviolet. In particular, $SrGa_2S_4:Eu^{2+}$ is strongly absorbed in a range between about 380 nm and about 480 nm, and $CaGa_2S_4:Eu^{2+}$ is strongly absorbing in a range between about 380 nm and about 510 nm. Consequently, $SrGa_2:Eu^{2+}$ and $CaGa_2S_4:Eu^{2+}$ can be excited by the emission of an $Al_xIn_yGa_zN$ based LED. For example, $Al_xIn_yGa_zN$ based LED emission spectrum 4 peaking at about 450 nm substantially overlaps $SrGa_2S_4:Eu^{2+}$ excitation spectrum 2 and $CaGa_2S_4:Eu^{2+}$ excitation spectrum 3. The resulting emission spectrum 5 and $SrGa_2S_4:Eu^{2+}$ and emission spectrum 6 of $CaGa_2S_4:Eu^{2+}$ peak, respectively, at about 537 nm and about 560 nm. Both the $SrGa_2S_4:Eu^{2+}$ emission spectrum and the $CaGa_2S_4:Eu^{2+}$ emission spectrum have a full width at half maximum of about 50 nm, which is comparable to that of a green light emitting $Al_xIn_yGa_zN$ based LED.

Optical excitation of and emission from $(Sr_{1-u-v-x}Mg_uCa_vBa_x)(Ga_{2-y-z}Al_yIn_zS_4):Eu^{2+}$ materials occur via a strongly crystal field dependent optical transition between $Eu^{2+}$ $4f$ ground state and $5d$ first excited state. This parity allowed transition has a high dipole-allowed oscillator strength which results in strong absorption, intense emission, rapidly decaying photoluminescence, and high luminescence quantum efficiency. Internal and external quantum efficiencies greater than about 90% can be achieved with this material.

The crystal field dependence of the $4f$–$5d$ optical transition also results in shifts of the $SrGa_2S_4:Eu^{2+}$ emission spectrum with partial or complete substitution of barium, calcium, magnesium, or another ion from column II-A of the periodic table for strontium (as shown in FIG. 1), and with partial or complete substitution of aluminum, indium, or another ion from column IIIA of the periodic table for gallium. In particular, the peak wavelength of the emission spectrum of $SrGa_2S_4:Eu^{2+}$ can be shifted continuously from about 537 nm (green) to about 510 nm (blue-green) by partial or complete substitution of magnesium for strontium, and from about 537 nm to about 560 nm by partial or complete substitution of calcium for strontium. The peak wavelength can be shifted to about 610 nm by partial or complete substitution of barium for strontium. The peak wavelength of the emission spectrum $SrGa_2S_4:Eu^{2+}$ can also be shifted continuously from about 537 nm to about 490 nm (blue-green) by partial or complete substitution of aluminum for gallium, and from about 537 nm to about 610 nm by partial substitution (0 to about 50%) of indium for gallium. Thus, the peak emission wavelength of $(Sr_{1-u-v-x}Mg_uCa_vBa_x)(Ga_{2-y-z}Al_yIn_zS_4):Eu^{2+}$ phosphors employed in accordance with embodiments of the present invention can be continuously tuned from about 490 nm to about 610 nm.

The crystal field dependence of the optical transition also results in shifts of the broad $SrGa_2S_4:Eu^{2+}$ absorption spectrum with partial or complete substitution of other II-A ions for strontium (as shown in FIG. 1), and with partial or complete substitution of other III-A ions for gallium. Despite the shifts in the absorption spectra, however, most of the $(Sr_{1-u-v-x}Mg_uCa_vBa_x)(Ga_{2-y-z}Al_yIn_zS_4):Eu^{2+}$ phosphors can be excited by blue or ultraviolet emission from, for example, an $Al_xIn_yGa_zN$ based LED.

Embodiments of the present invention may employ blue or ultraviolet light emitting diodes such as, for example, $Al_xIn_yGa_zN$ based LEDs disclosed in U.S. Pat. No. 6,133,589, incorporated herein by reference in its entirety, and $Al_xIn_yGa_zN$ based flip-chip LEDs disclosed in U.S. patent application Ser. No. 09/469,657, assigned to the assignee of the present invention and incorporated herein by reference in its entirety. Blue and ultraviolet light emitting LEDs based on other material systems, such as II–VI compound semiconductors, may also be employed in embodiments of the present invention.

Figure 2:
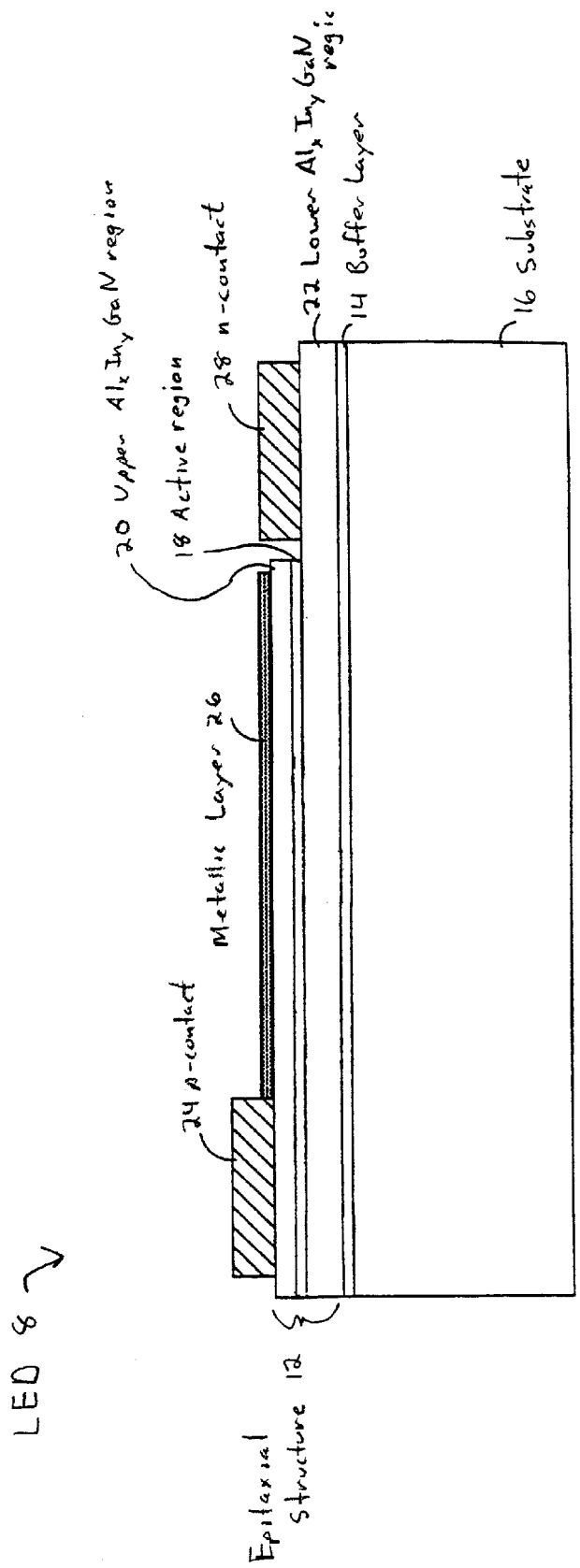
FIG. 2 is a schematic diagram of a light emitting diode employed in an embodiment of the present invention.

Referring to FIG. 2, for example, one embodiment of the present invention employs $Al_xIn_yGa_zN$ based LED 8. LED 8 includes a multilayered epitaxial structure 12 disposed on a buffer layer 14, which in turn is disposed on substrate 16.

Substrate 16 may be formed, for example, from sapphire (Al$_2$O$_3$) or silicon carbide. Epitaxial structure 12 includes active region 18 disposed between p-type upper Al$_x$In$_y$Ga$_z$N region 20 and lower Al$_x$In$_y$Ga$_z$N region 22. Al$_x$In$_y$Ga$_z$N region 22 includes n-type and/or undoped Al$_x$In$_y$Ga$_z$N layers. Active region 18 includes one or more quantum wells formed from layers of Al$_x$In$_y$Ga$_z$N. Ohmic p-contact 24 and metallic layer 26 are electrically coupled to each other and to upper Al$_x$In$_y$Ga$_z$N region 20. Ohmic n-contact 28 is electrically coupled to lower Al$_x$In$_y$Ga$_z$N region 22. Application of a suitable forward bias across contacts 24 and 28 results in injection of electrons and holes into active region 18. Radiative recombination of electrons and holes in active region 18 generates light. In one implementation, metallic layer 26 is semitransparent to light emitted by active region 18. In another implementation, metallic layer 26 is highly reflective to light emitted by active region 18, and LED 8 is mounted as a flip-chip with contacts 24 and 28 facing a submount. It should be understood that the composition of Al$_x$In$_y$Ga$_z$N may vary between the various layers and regions in LED 8.

Figure 3:
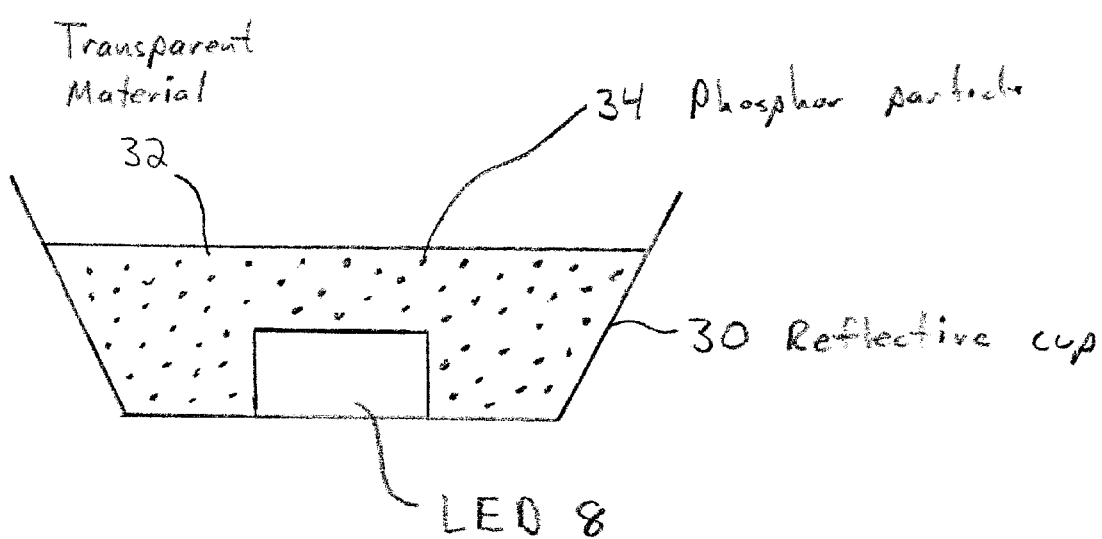
FIG. 3 is a schematic diagram of a phosphor converted light emitting diode including phosphor particles in accordance with an embodiment of the present invention.

Referring to FIG. 3, in accordance with one embodiment of the present invention a phosphor converted LED 29 includes an LED such as LED 8. LED 8 is disposed in a reflective cup 30, which also contains a substantially transparent material 32 in which are dispersed (Sr$_{1-u-v-x}$Mg$_u$Ca$_v$Ba$_x$)(Ga$_{2-y-z}$Al$_y$In$_z$S$_4$):Eu$^{2+}$ phosphor particles 34. Material 32 and phosphor particles 34 are disposed around LED 8. During operation of phosphor converted LED 29, at least a portion of the blue or ultraviolet primary light emitted by LED 8 excites phosphor particles 34 which in response emit longer wavelength secondary light. Reflective cup 30 reflects some unabsorbed primary light back to phosphor particles 34 and thus enhances the conversion of primary light to secondary light. Reflective cup 30 also directs a mixture of secondary light and unabsorbed primary light away from LED 8 to form an optical output of phosphor converted LED 29.

Typically, the (Sr$_{1-u-v-x}$Mg$_u$Ca$_v$Ba$_x$)(Ga$_{2-y-z}$Al$_y$In$_z$S$_4$):Eu$^{2+}$ phosphor particles 34 are about 0.5 microns ($\mu$m) to about 10 $\mu$m in diameter, and are doped with Eu$^{2+}$ at a concentration of about 0.5 atomic percent to about 6.0 atomic percent. The phosphor particles may be synthesized, for example, by the methods described by Davolos et al. and Thi et al. or obtained, for example, from Phosphor Technology Ltd., Nazeing, Essex, England.

Material 32 is a material substantially transparent to the blue or ultraviolet primary emission of LED 8 and to the secondary emission of phosphor particles 34. Material 32 may be organic or inorganic and can include, for example, conventional epoxies, acrylic polymers, polycarbonates, silicone polymers, optical glasses, and chalcogenide glasses. One of ordinary skill in the art will recognize that material 32 and phosphor particles 34 can be disposed in reflective cup 32 by a variety of known methods including those disclosed, for example, in U.S. Pat. No. 5,959,316, incorporated herein by reference.

Figure 4A:
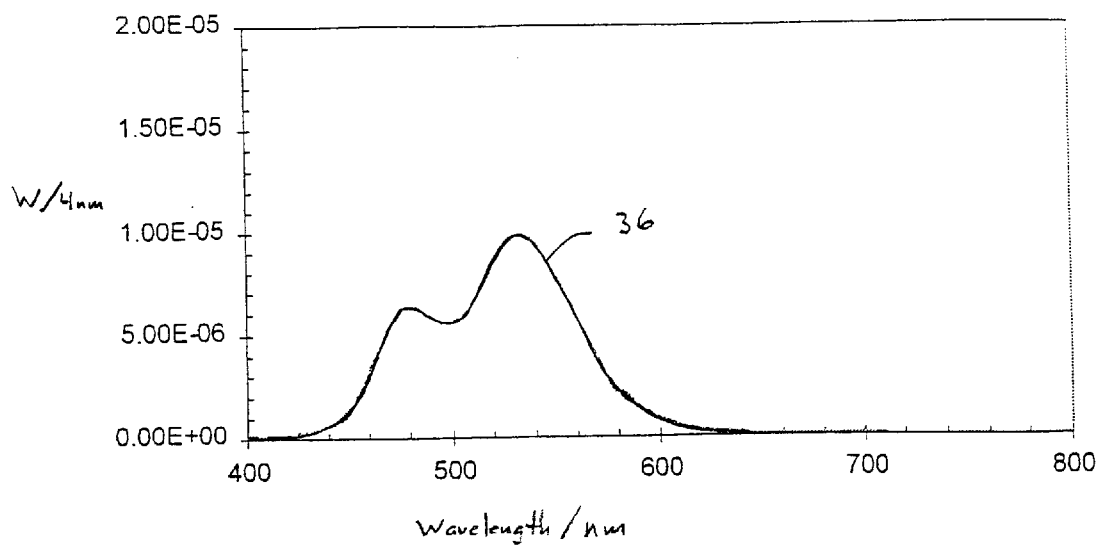
FIGS. 4A and 4B are illustrations of emission spectra of phosphor converted light emitting diodes including phosphor particles in accordance with embodiments of the present invention.
Figure 4B:
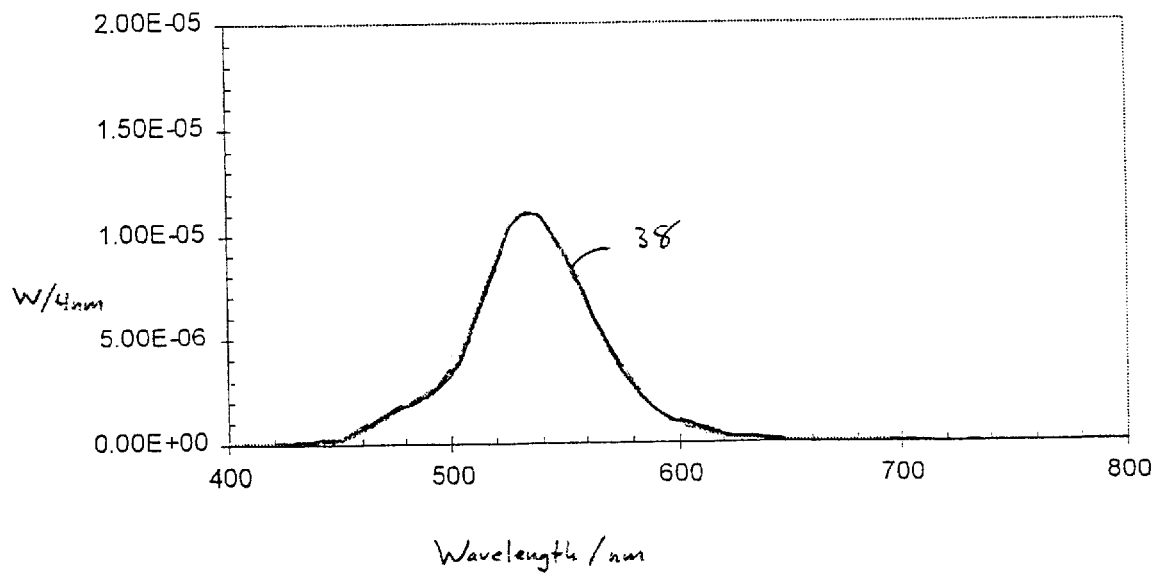

In the embodiment of FIG. 3, phosphor particles 34 are typically dispersed in material 32 at a concentration of about 5% to about 35% by weight, i.e, 100 grams (g) of a mixture of material 32 and phosphor particles 34 would typically include about 5 g to about 35 g of phosphor particles. The fraction of primary light converted to secondary light by phosphor particles 34 depends, in part, on the concentration of phosphor particles in material 32 and on the amount of the mixture of material 32 and phosphor particles 34 disposed around LED 8. For example, FIGS. 4A and 4B show emission spectra 36 and 38, respectively, for two otherwise substantially identical phosphor converted LEDs 29 in which SrGa$_2$S$_4$:Eu$^{2+}$ phosphors are dispersed in epoxy at concentrations of about 18% and about 36% by weight, respectively. The emission spectrum in FIG. 4A exhibits a phosphor emission peak at about 537 nm as well as a distinct peak at about 480 nm corresponding to blue primary emission from the LED which was not absorbed and converted by the phosphor particles. In contrast, the emission spectrum in FIG. 4B shows only 1 distinct peak at about 537 nm.

Typically, the concentration of phosphor particles 34 in material 32 is chosen to convert a desired fraction of primary light to secondary light. For example, in one embodiment the concentration of phosphor particles 34 is chosen such that the optical output of phosphor converted LED 29 (combined secondary and unabsorbed primary light emission) is of a desired chromaticity as characterized, for example, by Commission Internationale de l'Eclairage (CIE) chromaticity coordinates. One of ordinary skill in the art will recognize that the concentration of phosphor particles 34 appropriate to convert the desired fraction of primary light, or corresponding to a desired chromaticity of the optical output of phosphor converted LED 29, may be determined experimentally by measuring the emission spectrum corresponding to a trial concentration of phosphor particles and then adjusting the concentration as necessary. In one implementation, the concentration of phosphor particles is chosen such that less than about 5% of the optical power (light) emitted by phosphor converted LED 29 is primary emission from LED 8. In another implementation, less than 1% of the optical power (light) emitted by phosphor converted LED 29 is primary emission.

The efficiency with which primary light is converted to secondary light by phosphor particles 34 depends, in part, on the refractive index of material 32. In particular, if the refractive index of material 32 is less than that of the phosphor particles, a portion of the primary light is scattered by phosphor particles 34 back into LED 8 and reabsorbed rather than converted to secondary light. The refractive index of phosphor particles 34 is typically about 2.1 to about 2.4. Hence, in one implementation material 32 is chosen to have a refractive index greater than about 1.5, preferably greater than about 2.1. In such an implementation, material 32 may be a chalcogenide glass, for example.

The secondary light component of the emission spectrum of phosphor converted LED 29 can be tuned by varying the composition of the (Sr$_{1-u-v-x}$Mg$_u$Ca$_v$Ba$_x$)(Ga$_{2-y-z}$Al$_y$In$_z$S$_4$): Eu$^{2+}$ phosphor particles 34 as described above. In one embodiment the composition of the (Sr$_{1-u-v-x}$Mg$_u$Ca$_v$Ba$_x$)(Ga$_{2-y-z}$Al$_y$In$_z$S$_4$):Eu$^{2+}$ phosphor particles 34 is chosen such that the optical output of phosphor converted LED 29 (combined secondary and unabsorbed primary light emission) is of a desired chromaticity as characterized, for example, by Commission Internationale de l'Eclairage (CIE) chromaticity coordinates. One of ordinary skill in the art will recognize that a composition of phosphor particles 34 corresponding to a desired chromaticity of the optical output of phosphor converted LED 29 will depend on the emission characteristics of LED 8. An appropriate composition can be determined experimentally by measuring the emission spectrum of phosphor converted LED 29 for a trial composition of phosphor particles 34 and then adjusting the trial composition as necessary.

In one embodiment, the composition of phosphor particles 34 is chosen to provide a phosphor converted LED 29 having an optical output with approximately a desired chromaticity. Then, after the composition is chosen, the concentration of phosphor particles 34 is adjusted to vary the fraction of nonabsorbed primary emission and thus fine-tune the chromaticity. The composition and concentration of phosphor particles 34 may be varied iteratively, for example, until the desired chromaticity is achieved.

Figure 5:
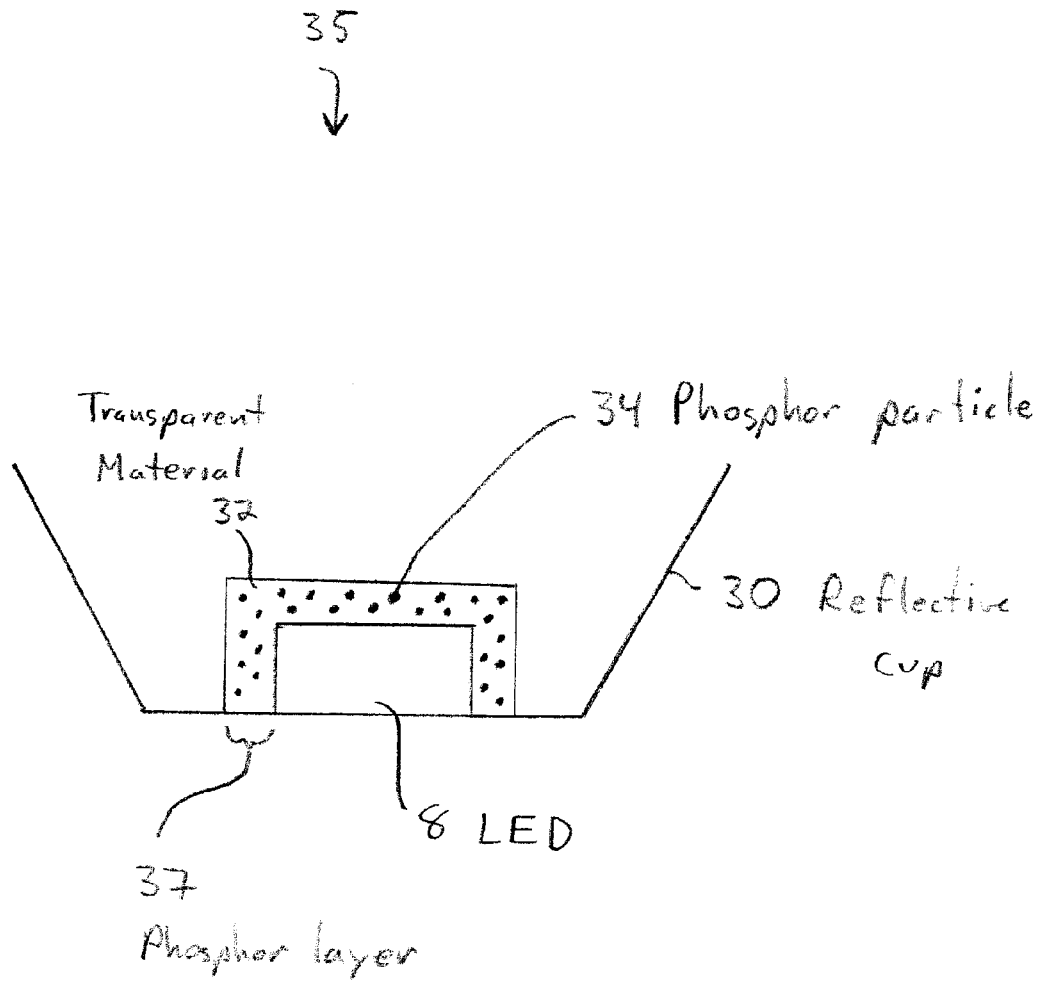
FIG. 5 is a schematic diagram of a phosphor converted light emitting diode including phosphor particles in accordance with another embodiment of the present invention.

Referring to FIG. 5, in another embodiment a phosphor converted LED 35 includes an LED 8 upon which has been deposited a phosphor layer 37 including phosphor particles 34 described above. In some embodiments phosphor layer 37 includes substantially transparent material 32 in which phosphor particles 34 are dispersed. In other embodiments, phosphor layer 37 does not include transparent material 32. Although phosphor layer 37 is shown deposited on the top and sides of LED 8, in other implementations phosphor layer 37 is deposited, for example, on only a top surface of LED 8. Also, although in FIG. 5 phosphor converted LED 35 is shown as including reflective cup 30, other implementations do not include reflective cup 30.

Methods by which phosphor layer 37 may be deposited include, for example, spraying, screen printing, electrophoresis, and dipping into a slurry. In one implementation, phosphor layer 37 is a conformal phosphor layer applied with a stenciling method described in U.S. patent application Ser. No. 09/688,053, assigned to the assignee of the present invention and incorporated herein by reference in its entirety. The concentration and composition of phosphor particles 34 in phosphor layer 37 may be adjusted to convert a desired fraction of primary light to secondary light and to produce an optical output of desired chromaticity by methods similar to those described above with reference to phosphor converted LED 29.

Phosphor converted LEDs in accordance with embodiments of the present invention have several advantages compared to conventional $Al_xIn_yGa_zN$ and $Al_xIn_yGa_zP$ based LEDs. In particular, phosphor converted LEDs in accordance with embodiments of the present invention a r e efficient light sources in the range from about 515 nm to about 590 nm in which conventional $Al_xIn_yGa_zN$ and $Al_x$-$In_yGa_zP$ based LEDs show a broad minimum in efficiency. Moreover, in contrast to conventional $Al_xIn_yGa_zN$ LEDs, phosphor converted LEDs in accordance with embodiments of the present invention in which a substantial portion of the primary emission is converted to secondary emission exhibit little or no blue shift in their emission with increasing drive current. In addition, phosphor converted LEDs in accordance with embodiments of the present invention may be manufactured with high production yields in narrow peak wavelength ranges from conventional $Al_xIn_yGa_zN$ and $Al_x$-$In_yGa_zP$ based LEDs, despite variations in the emission characteristics of nominally identical conventional LEDs. The latter two advantages result from the insensitivity of the secondary emission of phosphor converted LEDs in accordance with embodiments of the present invention to variations in the peak wavelength of the primary emission.

Since the size of phosphor particles 34 described above are on the order of a visible wavelength of light, the phosphor particles in phosphor layer 37 typically scatter the primary and secondary light emitted by phosphor converted LEDs 29 and 35. Hence phosphor layer 37 is typically optically heterogeneous, i.e., it scatters light. Optically homogeneous (substantially non-scattering) layers of phosphor containing material are referred to herein as "Phosphor films." Such phosphor films include, for example, films of substantially pure phosphor materials and films including phosphor particles substantially smaller than a visible wavelength of light dispersed in a substantially transparent material.

Figure 6:
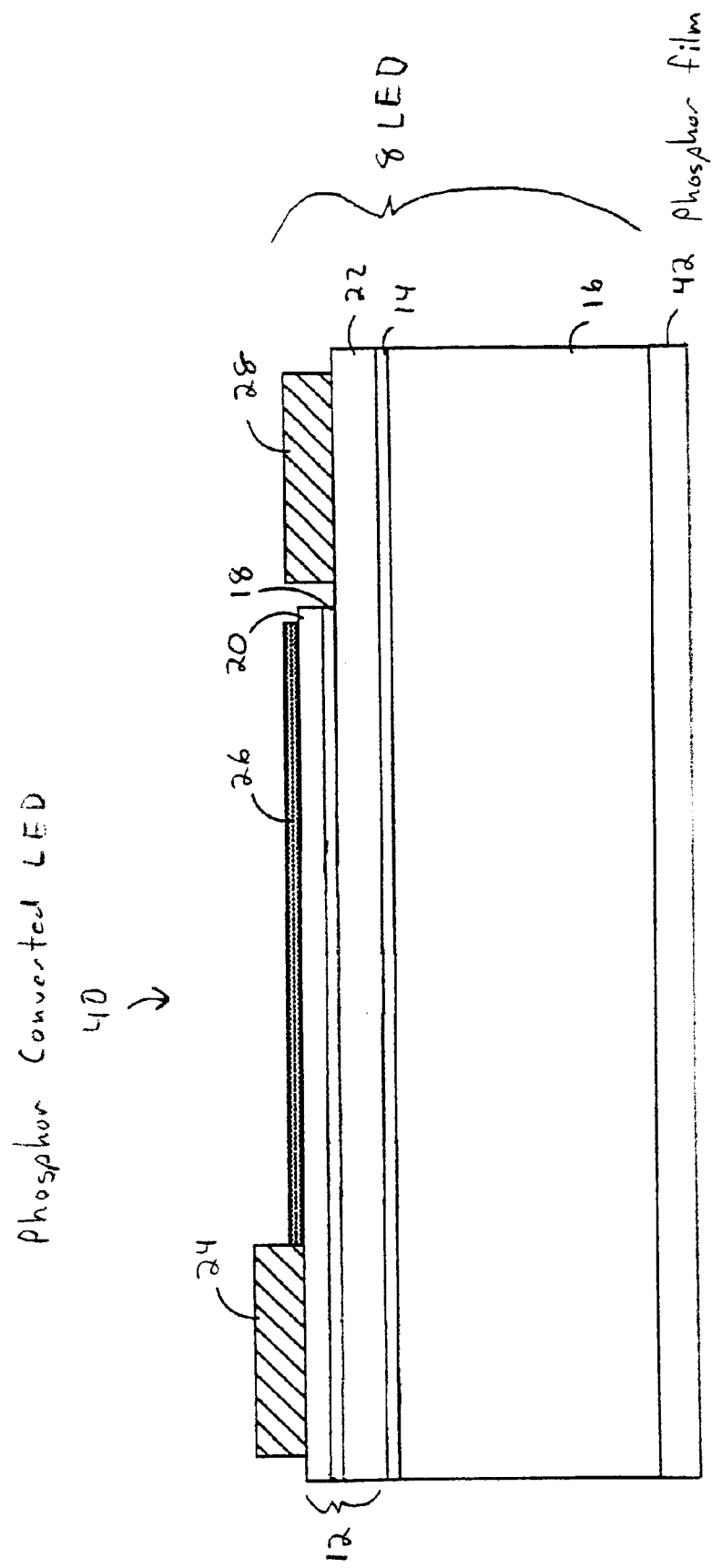
FIG. 6 is a schematic diagram of a phosphor converted light emitting diode including a phosphor film in accordance with an embodiment of the present invention.

Phosphor films may also be incorporated into phosphor converted LEDs. Referring to FIG. 6, for example, in accordance with another embodiment of the present invention a phosphor converted LED 40 includes a conventional LED such as LED 8 and a thin phosphor film 42 of substantially pure $(Sr_{1-u-v-x}Mg_uCa_vBa_x)(Ga_{2-y-z}Al_yIn_zS_4)$: $Eu^{2+}$ phosphor deposited on substrate 16 of LED 8. Like reference numbers in the various figures designate same parts in the various embodiments.

During operation of phosphor converted LED 40, at least a portion of the blue or ultraviolet primary light emitted by active region 18 of LED 8 is incident on and excites phosphor film 42, which in response emits longer wavelength secondary light. An optical output of phosphor converted LED 40 includes secondary light emitted by phosphor film 42 and unabsorbed primary light transmitted by phosphor film 42. In one implementation LED 8 is flip-chip LED, and metallic layer 26 is highly reflective to light emitted by active region 18 and thus increases the amount of primary light incident on phosphor film 42.

In one implementation, phosphor film 42 is deposited on substrate 16 prior to singulation of an LED wafer into individual LEDs such as LED 8. Preferably, phosphor film 42 is deposited on substrate 16 after the growth of epitaxial structure 12 and the deposition of contacts 24 and 28 and metallic layer 26. However, in some cases it may be necessary to deposit phosphor film 42 on substrate 16 prior to the growth of epitaxial structure 12 in order to avoid damaging epitaxial structure 12 during the phosphor deposition process.

Phosphor film 42 may be deposited on substrate 16 in accordance with embodiments of the present invention by, for example, conventional methods used in the thin film electroluminescent display industry to deposit thin phosphor films. Such known and conventional methods include, for example, electron beam evaporation, thermal evaporation, radio frequency sputtering (rf sputtering), reactive rf magnetron sputtering, and metal-organic chemical vapor deposition (MOCVD). One of ordinary skill in the art will recognize that the homogeneity of the composition and thickness of phosphor film 42 can be improved by, for example, rotating the LED wafer on which film 42 is deposited in eccentric circles during the deposition process.

In one embodiment, phosphor film 42 is deposited onto substrate 16 by conventional rf sputtering of the desired $(Sr_{1-u-v-x}Mg_uCa_vBa_x)(Ga_{2-y-z}Al_yIn_zS_4):Eu^{2+}$ phosphor material. The selected $(Sr_{1-u-v-x}Mg_uCa_vBa_x)(Ga_{2-y-z}Al_yIn_zS_4):Eu^{2+}$ phosphor material is pressed into a target typically having a diameter slightly exceeding that of the LED wafer and typically located about 5 cm to about 10 cm from substrate 16, and sputtered onto substrate 16 under an atmosphere comprising argon.

In another embodiment, phosphor film 42 is deposited onto substrate 16 by a conventional reactive rf magnetron sputtering method such as that described in P. Benalloul et al., "IIA-III$_2$-S$_4$ ternary compounds: New host matrices for full color thin film electroluminescence displays," Applied Physics Letters 63, 1954–1956 (1993) incorporated herein by reference in its entirety. In this embodiment, the sputter target is prepared from a mixture of several precursor powders from which the desired $(Sr_{1-u-v-x}Mg_uCa_vBa_x)(Ga_{2-y-z}Al_yIn_zS_4):Eu^{2+}$ phosphor material is synthesized during the deposition process. For example, in one implementation a $SrGa_2S_4:Eu^{2+}$ phosphor film 42 is grown on substrate 16 by conventional reactive rf magnetron sputtering of a target prepared from a mixture of SrS, $Ga_2S_3$, and EuS in which the portions of the three precursors were chosen to provide the desired composition of the phosphor. In this embodiment, deposition typically occurs under an atmosphere comprising argon gas and about 1 mole % to about 3 mole % $H_2S$.

In one implementation, after deposition by rf sputtering or reactive magnetron rf sputtering, for example, phosphor film 42 is annealed at a temperature of about 500° C. to about 800° C. The annealing process typically increases the crystallinity of phosphor film 42.

One of ordinary skill in the art will recognize that the deposition process can be conventionally regulated to control the thickness, typically about 2 μm to about 20 μm, of phosphor film 42. The thickness of phosphor film 42 may be chosen to convert a desired fraction of primary light to secondary light. In one implementation, the thickness of phosphor film 42 is chosen such that less than about 5% of the optical power (light) emitted by phosphor converted LED 40 is primary emission from LED 8. In another implementation, less than about 1% of the optical power (light) emitted by phosphor converted LED 40 is primary emission.

The secondary light component of the emission spectrum of phosphor converted LED 40 can be tuned by varying the composition of the $(Sr_{1-u-v-x}Mg_uCa_vBa_x)(Ga_{2-y-z}Al_yIn_zS_4)$: $Eu^{2+}$ material of phosphor film 42. In one embodiment, the composition and thickness of phosphor fin 42 are chosen such that the optical output (combined secondary and unabsorbed primary light) of phosphor converted LED 40 is of a desired chromaticity.

Figure 7:
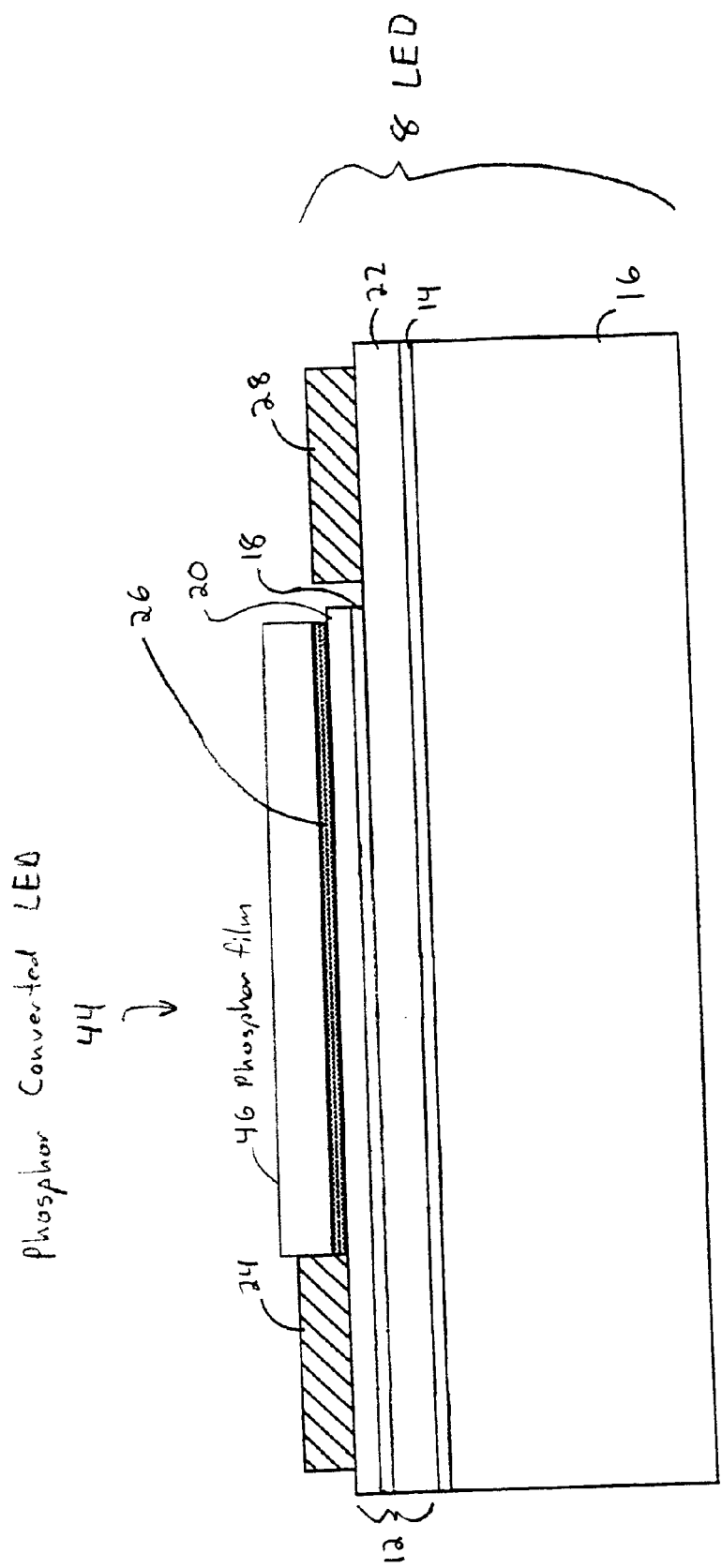
FIG. 7 is a schematic diagram of a phosphor converted light emitting diode including a phosphor film in accordance with another embodiment of the present invention.
Figure 1:
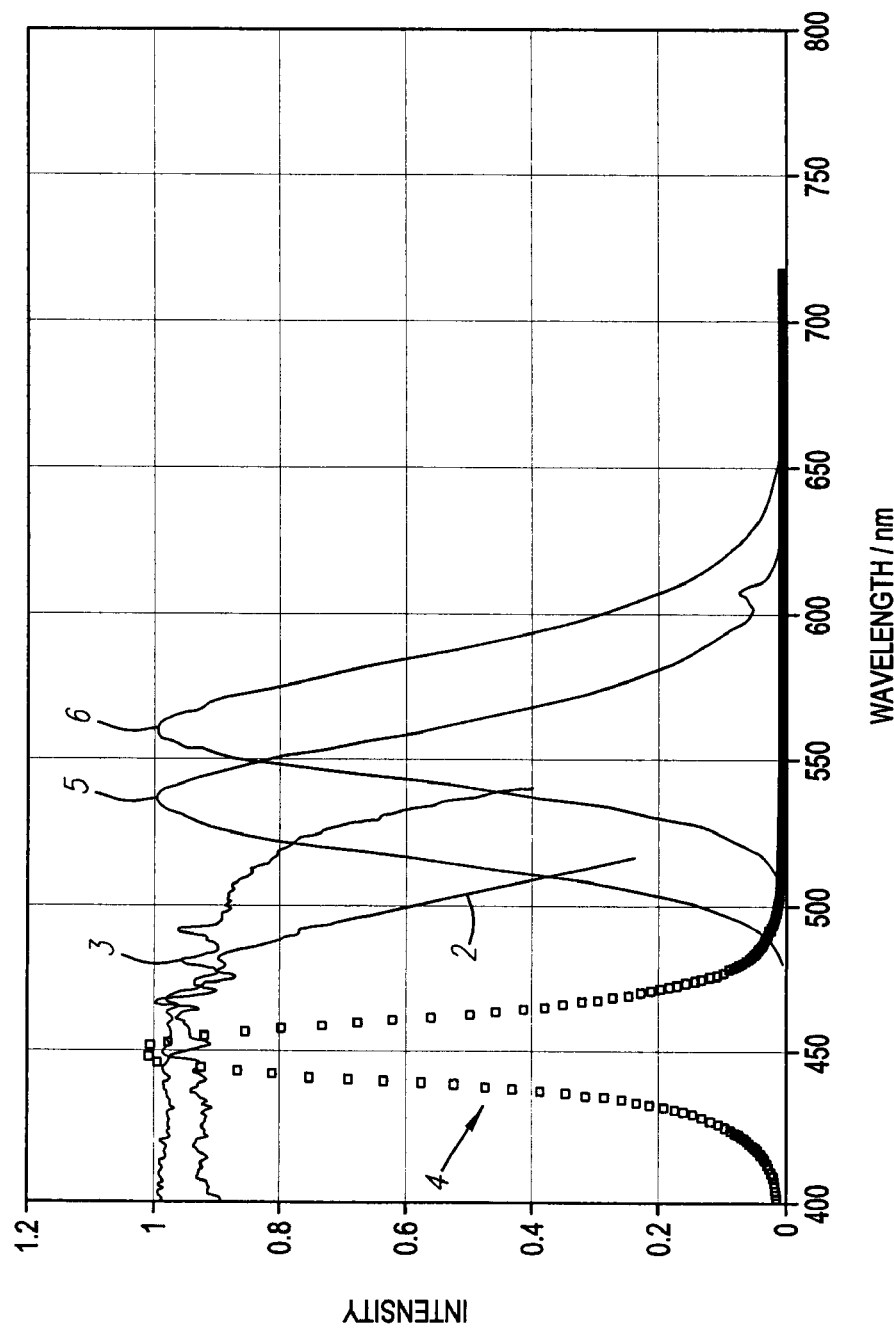
Figure 2:
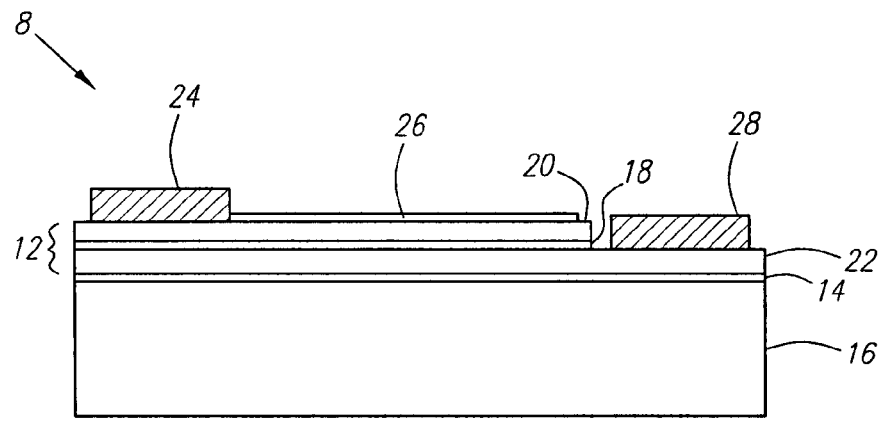
Figure 3:
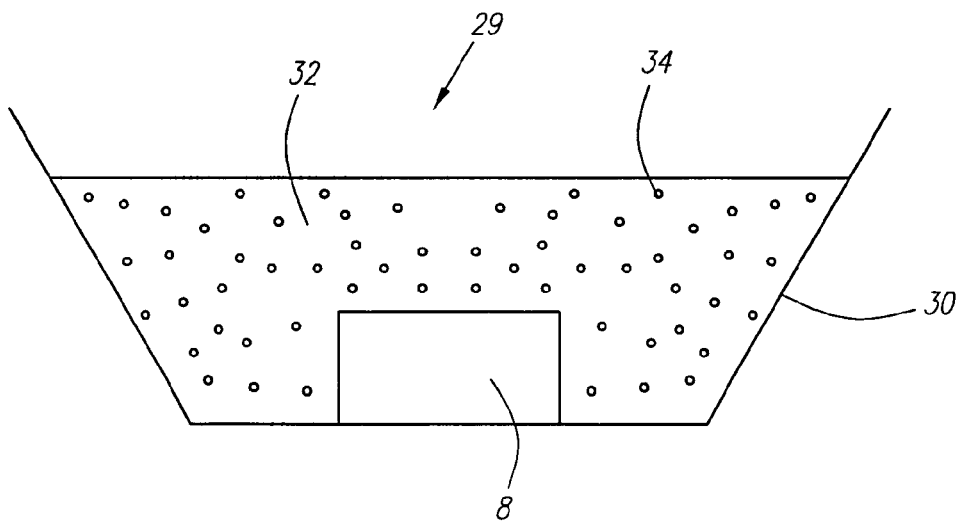
Figure 4A:
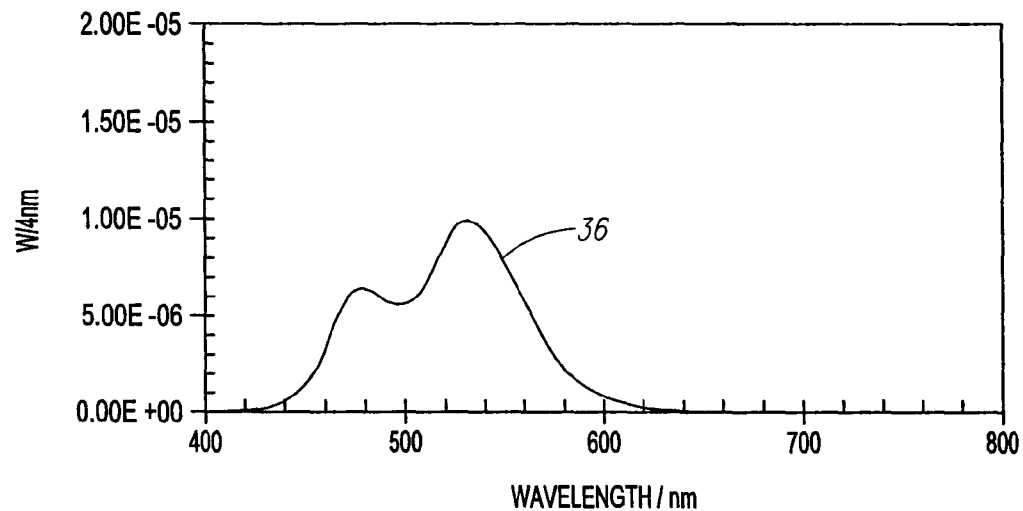
Figure 4B:
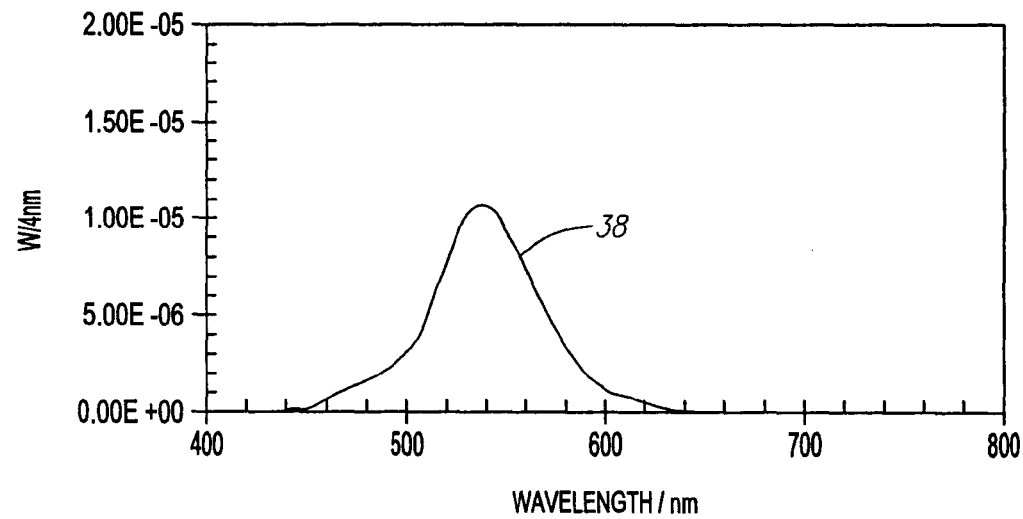
Figure 5:
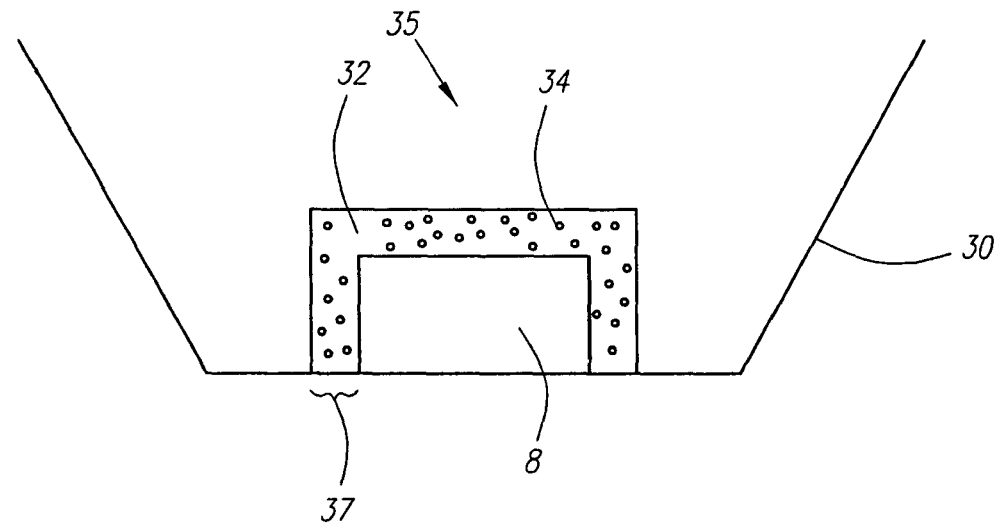
Figure 6:
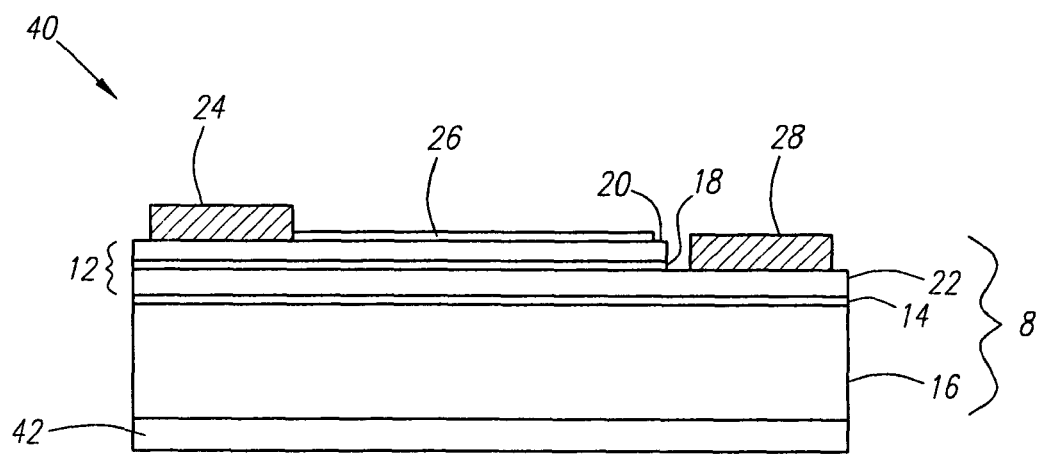
Figure 7:
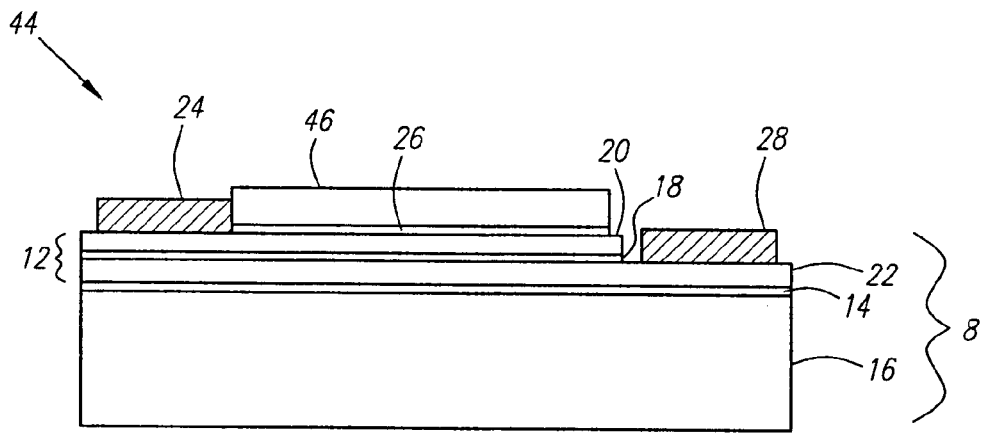

Although FIG. 6 shows phosphor film 42 deposited on substrate 12 of LED 8, in other embodiments phosphor films are deposited on other portions of LED 8. For example, in FIG. 7 phosphor converted LED 44 includes $(Sr_{1-u-v-x}Mg_uCa_vBa_x)(Ga_{2-y-z}Al_yIn_zS_4)$:$Eu^{2+}$ phosphor film 46 deposited on metallic layer 26, which is semitransparent in this implementation. In an other implementation, metallic layer 26 is not present in phosphor converted LED 44 and phosphor film 46 is disposed on, for example, upper $Al_x$-$In_yGa_zN$ region 20.

Figure 8:
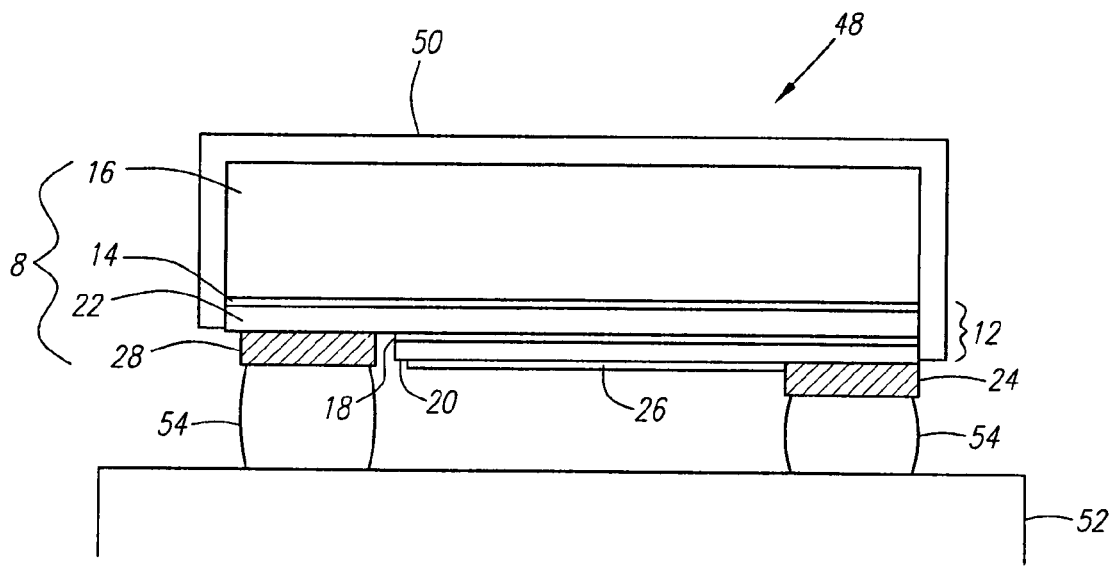
FIG. 8 is a schematic diagram of a phosphor converted light emitting diode including a phosphor film in accordance with another embodiment of the present invention.

In another embodiment, an LED wafer is singulated prior to deposition of a phosphor film. Hence the phosphor film may be deposited on the sides of the LED die. Deposition of a phosphor film on the sides as well as the top of an LED die increases the efficiency with which primary light is converted to secondary light, since primary light that would otherwise escape to the sides of the LED die is converted by the phosphor film. Referring to FIG. 8, for example, phosphor converted LED 48 includes LED 8 and phosphor film 50 deposited on top and side surfaces of LED 8. In the example of FIG. 8, phosphor converted LED 48 is mounted as a flip chip on submount 52 with solder bumps 54.

Phosphor converted LEDs 44 and 48 operate similarly to phosphor converted LED 40 described above. An optical output of phosphor converted LED 44 includes secondary light emitted by phosphor film 46 and unabsorbed primary light transmitted by phosphor film 46. An optical output of phosphor converted LED 48 includes secondary light emitted by phosphor film 50 and unabsorbed primary light transmitted by phosphor film 50. The thickness and composition of phosphor films 46 and 50 may be adjusted to convert desired fractions of primary light to secondary light and to produce optical outputs of desired chromaticity by methods similar to those described above with reference to phosphor converted LED 40.

Phosphor converted LEDs including $(Sr_{1-u-v-x}Mg_uCa_vBa_x)(Ga_{2-y-z}Al_yIn_zS_4)$:$Eu^{2+}$ phosphor films in accordance with embodiments of the present invention also provide the advantages recited above with respect to phosphor converted LEDs employing $(Sr_{1-u-v-x}Mg_uCa_vBa_x)(Ga_{2-y-z}Al_yIn_zS_4)$:$Eu^{2+}$ light-scattering phosphor particles (dispersed in another material, for example) in accordance with the present invention.

While the present invention is illustrated with particular embodiments, the invention is intended to include all variations and modifications falling within the scope of the appended claims. For example, a phosphor converted light emitting diode in accordance with the present invention may include a semiconductor laser diode. Also, phosphor converted LEDs in accordance with the present invention may include additional layers and substrates not depicted in the figures, such as reflective metallic layers, layers included in distributed Bragg reflectors, and layers included in optical interference filters, for example.

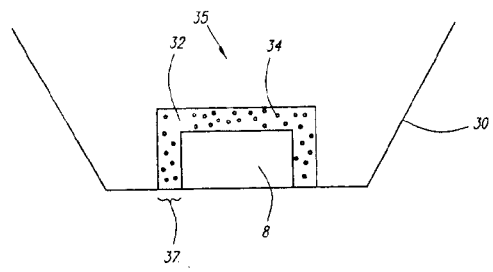

We claim:

1. A light emitting device comprising:
   a light emitting diode that emits primary light; and
   a $(Sr_{1-u-v-x}Mg_uCa_vBa_x)(Ga_{2-y-z}Al_yIn_zS_4)$:$Eu^{2+}$ phosphor material capable of absorbing at least a portion of said primary light and emitting secondary light having a wavelength longer than a wavelength of said primary light,
   wherein $0 \leq u \leq 1$, $0 \leq v \leq 1$, $0 \leq x \leq 1$, $0 \leq (u+v+x) \leq 1$, $0 \leq y \leq 2$, $0 \leq z \leq 2$, and $0 \leq y+z \leq 2$.

2. The light emitting device of claim 1, wherein said light emitting diode comprises an $Al_rIn_sGa_tN$ material with $0 \leq r \leq 1$, $0 \leq s \leq 1$, $0 \leq t \leq 1$, and $r+s+t=1$.

3. The light emitting device of claim 1, wherein said light emitting diode is a laser diode.

4. The light emitting device of claim 1, wherein said primary light has a wavelength between about 380 nanometers and about 500 nanometers.

5. The light emitting device of claim 1, wherein said secondary light has a wavelength between about 490 nanometers and about 610 nanometers.

6. The light emitting device of claim 1, wherein said phosphor material absorbs a sufficient portion of said primary light that a total power of unabsorbed primary light is less than about 5% of a total power of all emitted secondary light.

7. The light emitting device of claim 1, wherein said phosphor material is dispersed as phosphor particles in another material disposed around at least a portion of said light emitting diode.

8. The light emitting device of claim 7, wherein a layer of said phosphor particles and said other material is disposed on at least one surface of said light emitting diode.

9. The light emitting device of claim 7, wherein said other material is a material selected from the group consisting of epoxies, acrylic polymers, polycarbonates, silicone polymers, optical glasses, and chalcogenide glasses.

10. The light emitting device of claim 7, wherein said other material has a refractive index greater than about 1.5 at a wavelength of said primary light.

11. The light emitting device of claim 7, wherein said other material has a refractive index greater than about 2.1 at a wavelength of said primary light.

12. The light emitting device of claim 1, wherein said phosphor material is deposited as an optically homogenous phosphor film on at least one surface of said light emitting diode.

13. The light emitting device of claim 12, wherein a thickness of said phosphor film is about 2 microns to about 20 microns.

14. The light emitting device of claim 12, wherein said light emitting diode includes a substrate layer, and said phosphor film is deposited on at least one surface of said substrate layer.

15. A method of fabricating a light emitting device, the method comprising:

provixing a light emitting diode that emits primary light; and positioning a $(Sr_{1-u-v-x}Mg_uCa_vBa_x)(Ga_{2-y-z}Al_yIn_zS_4):Eu^{2+}$ phosphor material relative to said light emitting diode such that said phosphor material can absorb at least a portion of said primary light and emit secondary light having a wavelength longer than a wavelength of said primary light, wherein $0 \leq u \leq 1$, $0 \leq v \leq 1$, $0 \leq x \leq 1$, $0 \leq (u+v+x) \leq 1$, $0 \leq y \leq 2$, $0 \leq z \leq 2$, and $0 \leq y+z \leq 2$.

16. The method of claim 15, wherein said light emitting diode comprises an $Al_rIn_sGa_tN$ material with $0 \leq r \leq 1, 0 \leq s \leq 1, 0 \leq t \leq 1$, and $r+s+t=1$.

17. The method of claim 15, wherein said light emitting diode is a laser diode.

18. The method of claim 15, wherein said primary light has a wavelength between about 380 nanometers and about 500 nanometers.

19. The method of claim 15, wherein said secondary light has a wavelength between about 490 nanometers and about 610 nanometers.

20. The method of claim 15, further comprising selecting values of u, v, x, y, and z to determine a wavelength of said secondary light.

21. The method of claim 15, further comprising dispersing said phosphor material as phosphor particles in another material, and disposing said other material around at least a portion of said light emitting diode.

22. The method of claim 21, wherein said other material is a material selected from the group consisting of epoxies, acrylic polymers, polycarbonates, silicone polymers, optical glasses, and chalcogenide glasses.

23. The method of claim 21, wherein said other material has a refractive index greater than about 1.5 at a wavelength of said primary light.

24. The method of claim 21, wherein said other material has a refractive index greater than about 1.8 at a wavelength of said primary light.

25. The method of claim 21, further comprising selecting a concentration of said phosphor particles in said other material such that said phosphor particles absorb a sufficient portion of said primary light that a total power of unabsorbed primary light is less than about 5% of a total power of all emitted secondary light.

26. The method of claim 21, further comprising selecting a concentration of said phosphor particles in said other material to adjust a chromaticity of a mixture of said primary light and said secondary light.

27. The method of claim 15, further comprising depositing said phosphor material as an optically homogenous phosphor film on at least one surface of said light emitting diode.

28. The method of claim 27, further comprising selecting a thickness of said phosphor film such that said phosphor film absorbs a sufficient portion of said primary light that a total power of unabsorbed primary light is less than about 5% of a total power of all emitted secondary light.

29. The method of claim 27, further comprising selecting a thickness of said phosphor film to adjust a chromaticity of a mixture of said primary light and said secondary light.

30. The method of claim 27, further comprising annealing said film at a temperature of about 500° C. to about 800° C.

31. The light emitting device of claim 1, wherein said phosphor material is positioned directly on at least a portion of said light emitting diode.

32. A light emitting device comprising:

a light emitting diode that emits blue light; and a $(Sr_{1-u-v-x}Mg_uCa_vBax)(Ga_{2-y-z}Al_yIn_zS_4):Eu^{2+}$ phosphor material capable of absorbing at least a portion of said blue light and emitting secondary light having a wavelength longer than a wavelength of said blue light, wherein $0 \leq u \leq 1, 0 \leq v \leq 1, 0 \leq x \leq 1, 0 \leq (u+v+x) \leq 1$, $0 \leq y \leq 2, 0 \leq z \leq 2$, and $0 \leq y+z \leq 2$.

33. The light emitting device of claim 32, wherein said phosphor material is dispersed as phosphor particles in another material disposed around at least a portion of said light emitting diode.

34. The light emitting device of claim 32, wherein said phosphor material is deposited as an optically homogenous phosphor film on at least one surface of said light emittind diode.

* * * * *

UNITED STATES PATENT AND TRADEMARK OFFICE
CERTIFICATE OF CORRECTION

PATENT NO.   : 6,417,019 B1
DATED        : July 9, 2002
INVENTOR(S)  : Gerd O. Mueller and Regina B. Mueller-Mach It is certified that error appears in the above-identified patent and that said Letters Patent is hereby corrected as shown below:

Column 10,
Line 22, between the words "material" and "capable" please insert
-- overlying at least a portion of a surface of said light emitting diode and --.

Column 11,
Line 9, cancel "positioning" and substitute -- providing --.
Line 10, cancel "relative to" and substitute -- overlying at least a portion of a surface of --.

Column 12,
Line 30, cancel "Ba$x$" and substitute -- Ba$_x$ --.

Signed and Sealed this

Thirteenth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,417,019 B1
DATED : July 9, 2002
INVENTOR(S) : Gerd O. Mueller and Regina B. Mueller-Mach It is certified that error appears in the above-identified patent and that said Letters Patent is hereby corrected as shown below:

The title page showing an illustrative figure, should be deleted and substitute therefor the attached title page.

Delete Drawing Sheets 1-8 and substitute therefor the Drawing Sheets consisting of FIG 1-8 as shown on the attached pages.

Signed and Sealed this

Sixth Day of December, 2005

JON W. DUDAS
*Director of the United States Patent and Trademark Office*

(12) United States Patent
Mueller et al.

(10) Patent No.: US 6,417,019 B1
(45) Date of Patent: Jul. 9, 2002

(54) PHOSPHOR CONVERTED LIGHT EMITTING DIODE

(75) Inventors: Gerd O. Mueller; Regina B. Mueller-Mach, both of San Jose, CA (US)

(73) Assignee: LumiLeds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/827,382

(22) Filed: Apr. 4, 2001

(51) Int. Cl.$^7$ .................. H01L 21/00; H01L 33/00; H01L 23/29; G02B 26/00
(52) U.S. Cl. .................. 438/29; 257/98; 257/99; 257/100; 257/788; 359/294
(58) Field of Search .................. 438/29, 38, 49, 438/69, 70, 71, 72; 372/11, 32, 49; 359/248, 273, 294, 581; 257/98, 99, 100, 788, 789, 790, 793

(56) References Cited

U.S. PATENT DOCUMENTS

| | | | |
|---|---|---|---|
| 5,959,316 A | | 9/1999 | Lowery .................. 257/98 |
| 6,133,589 A | | 10/2000 | Krames et al. .................. 257/103 |
| 6,252,254 B1 | * | 6/2001 | Soules et al. .................. 257/89 |
| 6,255,670 B1 | * | 7/2001 | Srivastava et al. .................. 257/89 |
| 6,273,589 B1 | | 8/2001 | Weber et al. .................. 362/293 |
| 6,294,800 B1 | * | 9/2001 | Duggal et al. .................. 257/89 |

FOREIGN PATENT DOCUMENTS

| WO | WO 00/33389 | 6/2000 |
|---|---|---|
| WO | WO 00/33390 | 6/2000 |

OTHER PUBLICATIONS

P. Benalloul et al., "IIA–III$_2$–S$_4$ Ternaly Compounds: New Host Matrices For Full Color Thin film Electroluminescence Displays", Appl. Phys. Lett., pp. 1954–1956.

T. E. Peters et al., "Luminescence And Structural Properties Of Tiogallate Phosphors Ce$^{+3}$ And Eu$^{+2}$–Activated Phosphors. Part I", J. Electrochem. Soc.: Solid–State Science and Technology, Feb. 1972, pp. 230–236.

K. T. Le Thi et al., "Investigation Of The MS–Al$_2$S$_3$ Systems (M=Ca, Sr, Ba) And Luminescence Properties Of Europium–Doped Thioaluminates", Materials Science and Engineering, B14 1992, pp. 393–397.

M. R. Davolos et al., "Luminescence Of Eu$^{2+}$ In Strontium And Barium Thiogallates", Journal of Solid State Chemistry 83, 1989, pp. 316–323.

Copy of co-pending U.S. application No. 09/405,947, filed Sep. 27, 1999, 19 pages.

P. Bénalloul, C. Barthou, J. Benoit, SrGa$_2$S$_4$: RE phosphors for full colour electroluminescent displays:, Journal of Alloys and Compounds 275–277 (1998), pp. 709–715.

* cited by examiner

*Primary Examiner*—John F. Niebling
*Assistant Examiner*—Viktor Simkovic
(74) *Attorney, Agent, or Firm*—Skjerven Morrill LLP; Mark E. Schmidt

(57) ABSTRACT

A method of fabricating a light emitting device includes providing a light emitting diode that emits primary light, and locating proximate to the light emitting diode a $(Sr_{1-u-v-x}Mg_uCa_vBa_x)(Ga_{2-y-z}Al_yIn_zS_4):Eu^{2+}$ phosphor material capable of absorbing at least a portion of the primary light and emitting secondary light having a wavelength longer than a wavelength of the primary light. The composition of the phosphor material can be selected to determine the wavelengths of the secondary light. In one embodiment, the light emitting device includes the phosphor material dispersed as phosphor particles in another material disposed around the light emitting diode. In another embodiment, the light emitting device includes the phosphor material deposited as a phosphor film on at least one surface of the light emitting diode.

34 Claims, 8 Drawing Sheets